United States Patent [19]
Stoddard

[11] Patent Number: 5,459,642
[45] Date of Patent: * Oct. 17, 1995

[54] CAPACITOR MOUNTING STRUCTURE FOR PRINTED CIRCUIT BOARDS

[75] Inventor: D. Joe Stoddard, Houston, Tex.

[73] Assignee: Compaq Computer Corp., Houston, Tex.

[*] Notice: The portion of the term of this patent subsequent to Dec. 20, 2011 has been disclaimed.

[21] Appl. No.: 253,980

[22] Filed: Jun. 3, 1994

Related U.S. Application Data

[63] Continuation of Ser. No. 35,393, Mar. 22, 1993, Pat. No. 5,375,035.

[51] Int. Cl.$^6$ .................................................. H01G 2/06
[52] U.S. Cl. .................. 361/774; 361/306.2; 361/309; 361/310; 361/782; 174/260
[58] Field of Search ................................ 361/275.1, 303, 361/306.1, 306.2, 306.3, 309, 308.2, 310, 734, 760, 767, 768, 772, 774, 782, 808, 811, 777; 174/260, 262, 264

[56] References Cited

U.S. PATENT DOCUMENTS

| 3,302,067 | 1/1967 | Jackson et al. ........................ 361/772 |
| 3,403,438 | 10/1968 | Best et al. . |
| 3,934,073 | 1/1976 | Ardezzone . |
| 3,967,296 | 6/1976 | Intrator . |
| 4,130,722 | 12/1978 | Levijoki .................................. 174/260 |
| 4,430,690 | 2/1984 | Chance et al. . |
| 4,648,006 | 3/1987 | Rayburn . |
| 4,754,366 | 6/1988 | Hernandez . |
| 4,910,643 | 3/1990 | Williams ................................. 361/771 |
| 4,954,929 | 9/1990 | Baran ..................................... 361/794 |
| 5,184,287 | 2/1993 | Taniguchi . |
| 5,210,683 | 5/1993 | Ley . |
| 5,375,035 | 12/1994 | Stoddard ............................... 361/306.2 |

OTHER PUBLICATIONS

John Sisler, Eliminating Capacitors From Multilayer PCBS, (7 pages), Jul. 1991–Reprinted from Printed Circuit Design vol. 8, No. 7, Jul. 1991.

Simon Ramo, et al., Fields and Waves in Communication Electronics Second Edition, pp. 79–81, 1985.

IBM Technical Disclosure Bulletin, vol. 19, No. 8, Jan. 1977 pp. 3046–3047.

Japanese Abstract, vol. 16 No. 554 (E–1293)25, Nov. 1992 & JP-A-04 211 191, Hitachi Ltd. Aug. 3, 1992.

Primary Examiner—Teresa J. Walberg
Assistant Examiner—Gregory L. Mills
Attorney, Agent, or Firm—Pravel, Hewitt, Kimball & Krieger

[57] ABSTRACT

A capacitor mounting structure for printed circuit boards wherein the capacitor includes first and second terminals which are connected to first and second conductor planes in the printed circuit board. Three vias are mounted in the printed circuit board in a position to be aligned with the middle of the capacitor. A first conductor pad is mounted underneath one end of the capacitor and includes spaced apart extension portions which electrically attach to the first and third via. A second conductor pad is mounted under the other end of the capacitor and includes a central extension portion which attaches to the second or middle via. In this manner, the region available for generation of parasitic inductance is minimized thereby increasing the operating efficiency of the capacitor.

14 Claims, 2 Drawing Sheets

CAPACITOR MOUNTING STRUCTURE FOR PRINTED CIRCUIT BOARDS

This is a continuation of application Ser. No. 08/035,393, filed Mar. 22, 1993, now issued as U.S. Pat. No. 5,375,035 on Dec. 20, 1994.

FIELD OF THE INVENTION

The field of this invention relates to a structure for mounting a capacitor onto a printed circuit board which minimizes parasitic inductance.

BACKGROUND OF THE INVENTION

It is well known in the art of printed circuit board design to utilize capacitors to smooth the effects of sporadic current peaks and noise typical of electronic circuity. Theoretically, a capacitor has the characteristic of maintaining a substantially constant voltage while absorbing applied current changes, which is a typically important function in computer circuit design where current surges and peaks due to noise and the like must be smoothed to prevent interference with signal generation. In other words, capacitors are used to stabilize the supply voltage by compensating for abrupt current changes.

However, due to the application of current across a capacitor, the capacitor generates an inductance called "parasitic" inductance. And, Just as in the case of an inductor, such parasitic inductance can limit the rate of current change across the capacitor and thus cause the voltage to drop in spite of the presence of the capacitor. Further, such parasitic inductance can change the RF impedance characteristics of capacitors making them more complex elements in RF (radio frequency) applications, which makes design more complicated and performance objectives more difficult to achieve.

Methods have been tried to reduce parasitic capacitor inductance. One method is to reduce the length of conductor traces extending between the capacitor terminal and the pad of a via. Another suggestion is the widening of capacitors and traces and shortening or eliminating traces from the capacitor pads to vias. However, there is a lower limit on capacitor lengths. For example, if a capacitor is too short, there is not enough space between the metalized contacts located at the ends of the capacitors and solder bridging to the metalized contacts or terminals becomes a problem. Capacitor shortening can also be difficult where board fabrication processes set the minimum space between vias, which dictates the minimum total length for the capacitor and the mounting structure combined. Increasing capacitor width at minimum length increases space occupied by the capacitor which diminishes available board space. In addition, there is a limit to the ratio of width to length in capacitor fabrication. Even with maximized capacitor width, within the practical range of capacitor and trace widths, inductance can only be reduced 30–40%.

SUMMARY OF THE INVENTION

This invention is directed to a capacitor mounting structure for printed circuit boards which substantially minimizes parasitic capacitor inductance. In the capacitor mounting structure of this invention, the vias are mounted under the central section of the capacitor and in general alignment with each other. The pads which electrically attach to the vias include extensions or digits which provide for interdigitated mounting of the conductor pads to the vias.

Such a capacitor mounting structure includes the following specific components. The capacitor includes a central dielectric section and first and second opposing terminals. A printed circuit board includes an upper surface for receiving electronic components such as the capacitors and has first and second conductor planes generally parallel to the upper surface, one or both of the conductor planes being imbedded in the printed circuit board.

First, second and third vias are mounted in the printed circuit board underneath the central dielectric section of the capacitor. The three vias are in alignment. The two outside vias are electrically connected to a first via pad while the via located between the first two vias is electrically connected to the second via pad, the via pads or footprints being soldered to the opposing terminals of the capacitor. With positioning of the interdigitated traces and vias directly under the dielectric section of the capacitor, the magnetic field which forms between the capacitor and the traces is confined in a strait formed by the capacitor and the traces. The higher the ratio of the length of the strait to the narrow dimension of the strait, the lower the resulting inductance. The proposed structure minimizes inductance by minimizing the distance between the capacitor and the traces.

The summary of this invention is not intended to be exhaustive of the patentable features of this invention, which are set forth in the claims to be read in view of the specification.

DESCRIPTION OF THE PREFERRED EMBODIMENT

Figure 1A:
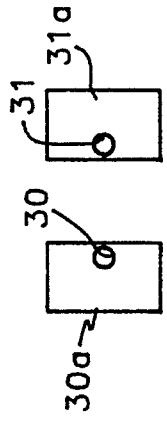
FIGS. 1 and 1A illustrate a prior art structure mounting a capacitor onto a printed circuit board wherein the vias are positioned away from the capacitor terminals.
Figure 1:
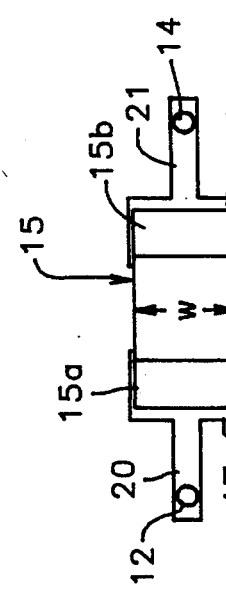

The problem of parasitic inductance in printed circuit board design is well known. FIGS. 1 and 1A–B illustrate a known mounting structure for a capacitor, which mounting structure creates undesirable levels of parasitic capacitive inductance. In FIG. 1, the printed circuit board B is represented by a first or upper conductor plane 10 and a second or lower conductor plane 11 which, in a well known manner, commonly provide power to the entire board. PCB board B includes upper non-conducting surface 10a. A first via 12 is electrically connected to the second conductor plane 11, which may be a voltage or power plane. The tubular conductor section of via 12 is shown as extending through an opening 10b in the upper conductor plane 10, which may be a ground plane, such that the via is not electrically connected to the ground plane. The tubular conductor section of via 14 is electrically connected to the upper or ground plane at 10c but extends through opening 11a in the voltage plane 11. The utilization of vias 12 and 14 to provide electrical connection to various conductor or ground planes in a printed circuit board is well known.

The capacitor 15 is illustrated as being mounted in between the vias 12 and 14. The capacitor 15 includes metallic terminals or caps 15a and 15b located at each end of the capacitor. The capacitor middle section 15C represents the central dielectric portion as is well known in the art. It is also known to connect capacitors such as 15 to the printed circuit board B through conductor pads or footprints 17 and 18 which are mounted onto the upper surface 10a of the printed circuit board. The capacitor 15 is electrically attached to the conductor pads 17 and 18 utilizing soldering techniques which produce the solder fillets 19a and 19b illustrated in FIG. 1. Electrical connection from the conductor pad 17a to the via 12 is provided by conductor line or trace 20. In the similar manner, a trace 21 extends electrical connection from the pad 18 to the via 14. In this manner, the capacitor 15 is mounted onto the printed circuit board B.

However, the mounting structure illustrated in FIGS. 1 and 1A cause undesirable parasitic inductance during operation. Referring to FIG. 1, the area which can be considered as generating the parasitic inductance is located between the vias 12 and 14, above the ground plane 10 and below the traces 20 and 21, conductor pads 17 and 18 and the bottom of the dielectric portion 15C of the capacitor. This area, defined by the letter I, is the critical region which causes the generation of parasitic inductance. While the area I is described as influential on generation of parasitic inductance, technically, it is the aspect ratio that must be minimized, which is the width w of capacitor 15 divided by the gap thickness or distance d between the bottom surface of the capacitor and the ground plane 10. The aspect ratio w/d is critical since it describes the effect of the strait on the magnetic field. As this aspect ratio w/d increases, the reluctance increases, which decreases the parasitic inductance generated. Stated another way, if the effect of the distance between capacitor solder pads is included, maximizing the aspect ratio of capacitor width to area I will minimize parasitic inductance of the capacitor.

Such undesirable parasitic inductance limits the rate of current change in pulse applications. For example, capacitors 15 are often used to stabilize supply voltages when the current increases abruptly. The presence of parasitic inductance limits the rate of current change and causes voltage to drop in spite of the utilization of capacitors. Further, inductance changes the RF impedance characteristics of capacitors, making them complex elements in RF applications, which makes design more complicated and performance objectives more difficult to achieve.

It is known to reduce capacitor inductance by reducing the length of traces such as 20 and 21 and or widening the capacitor 15, and even eliminating traces from capacitor pads to vias by placing the via within the pad.

Figure 2B:
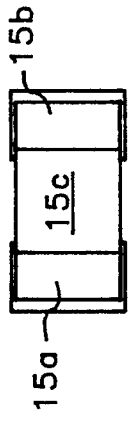
FIGS. 2 and 2A–B illustrate a capacitor mounting structure wherein the vias are located underneath the capacitor but in a position of non-alignment.
Figure 2A:
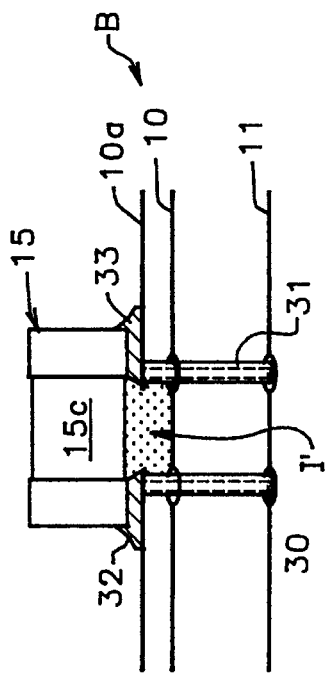
Figure 2:
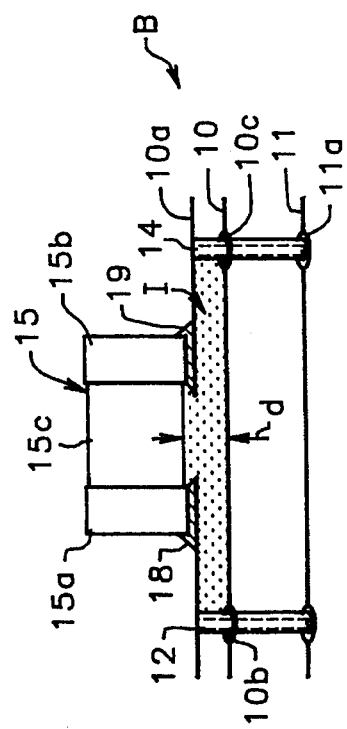

For example, FIGS. 2, 2A and 2B represent one such solution. The same numbers and letters will be used to describe the same elements. In FIG. 2, the capacitor 15 is actually mounted over vias 30 and 31. Via 30 is illustrated in connection with power plane 11 and via 31 is electrically connected to ground plane 10. Referring to FIGS. 2A and 2B, a rectangular conductor pad 30a is mounted over via 30 and similarly, a rectangular connector pad 31a is mounted over via 31. The metalized ends or caps 15a and 15b are electrically connected to the conductor pads 30a and 30b, respectively, by solder represented by soldering points 32 and 33. Referring now to FIG. 2, it can be seen that the area I' defined by the ground plane 10, vias 30 and 31, and the bottom surface of the central capacitor section 15c is a much smaller area than area I shown in FIG. 1. The reduction in the area I to I' thus reduces the amount of parasitic inductance generated during operation of the circuitry.

Another suggestion to reduce parasitic capacitance is to increase capacitor width and minimize capacitor length. However, an increase in the width of the capacitor increases the space necessary on the surface of the PCB board to accommodate the capacitor. Further, there is a limit to the ratio of width to length in capacitor fabrication. Finally with respect to capacitor width, within the practical range of capacitor and trace width, inductance can probably only be reduced about 30–40%.

Figure 3B:
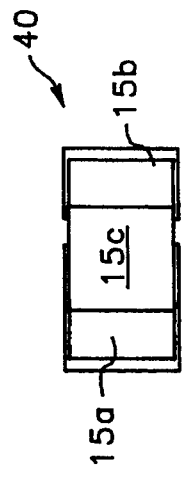
FIGS. 3 and 3A–B illustrate the capacitor mounting structure of this invention.
Figure 3A:
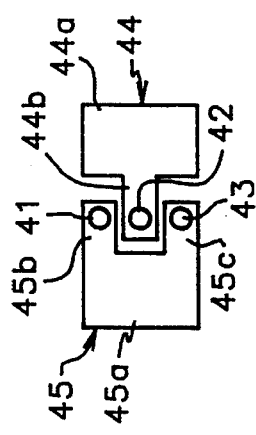
Figure 3:
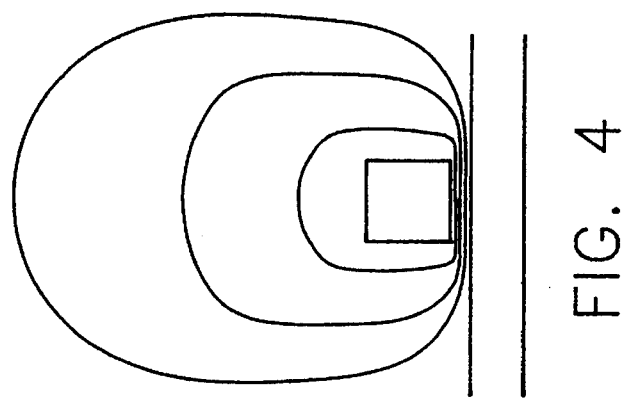

Referring now to FIGS. 3 and 3A–B, the capacitor mounting structure generally designated as 40 for minimizing parasitic inductance is illustrated. As before, the same numbers will be used to identify the same elements. Thus the PCB board generally designated as B includes the ground plane 10 and power plane 11 and has upper surface 10a. Three vias 41, 42 and 43, are positioned in substantially straight line alignment as illustrated in FIG. 3B and are located substantially adjacent to each other in a row, which row is approximately aligned with the centerline 50 of the capacitor 15. The vias 41–43 alternately electrically connect to either ground plane 10 or voltage plane 11. As illustrated in FIG. 3, tubular section of via 43 is electrically connected to the voltage plane 11 and extends through an opening in the ground plane 10. The tubular section of via 42 is electrically connected to the ground plane 10 and extends through an opening in the power plane 11. Though not shown, via 41 is electrically connected to the power plane 11.

The conductor pad or footprint 44 for via 42 is generally T-shaped and includes a central rectangular portion 44a formed with an extension or finger portion 44b, which extends into attachment to the top of the via 42.

The conductor pad 45 for vias 41 and 43, is generally U-shaped. A central rectangular portion 45a includes first and second extensions or fingers 45b and 45c which extend into connection with vias 41 and 43. A U-shaped recess is formed between the conductor pad extensions 45b and 45c. The conductor pad U-shaped recess formed between conductor pad extensions 45b and 45c receives the extension 44b for conductor pad 44. In this manner, the conductor pad extensions are interdigitated with respect to each other, so that effective electrical connection can be made with the vias 41–43 in substantially a straight line.

The capacitor end metal caps 15a and 15b are soldered onto the rectangular portions 45a and 44a of the pads, respectively. The solder pads 47 and 48 are applied as thinly as possible, such that there is little separation or thickness d" between the capacitor bottom surface and the conductor pads. In this manner, the cross-sectional area I" between the conductor pads, the solder points 47 and 48 and the bottom of the central capacitor section 15C is minimized in area, thereby minimizing the distance d" between the bottom of the capacitor and the pads 44 and 45 wherein parasitic inductor can be generated. Reduction of the distance d" between the conductor pads 44 and 45 and the bottom of the capacitor 15 maximizes the aspect ratio and minimizes the generation of inductance by maximizing reluctance. It is noted that placement of the conductor pads under the central section of the capacitor 15 also acts to reduce thickness d".

Figure 4:
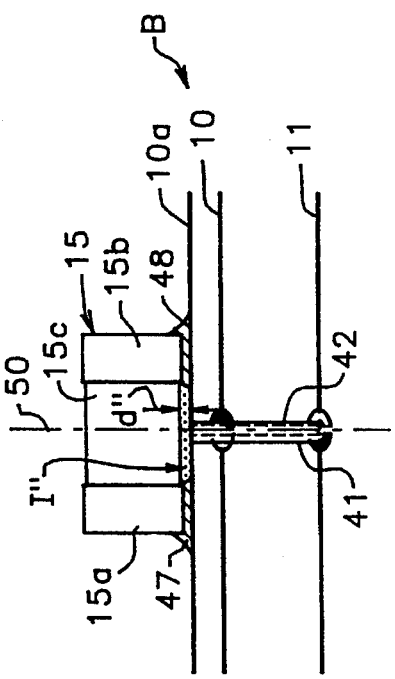
FIG. 4 illustrates the minimization of inductance generated by this invention.

Referring now to FIG. 4, the effect of the constriction on parasitic inductance generating region is illustrated. Constricting the field lines increases the reluctance of the magnetic path which in turn reduces magnetic flux and thus reduces inductance.

Further, the interdigitated vias formed by pad extensions 45b and 45c and 44b form a low inductance structure. It is believed that the insertion of the via 42 between vias 41 and 43 reduces inductance by a factor approaching 50%. A designer might typically add a pair of opposing vias (connected to ground and voltage planes) to reduce inductance roughly 50%; however, the proposed structure of FIG. 3 achieves the same benefit with only 3 vias instead of 4.

It is further contemplated that, while the capacitor mounting structure 40 of FIG. 3 shows 3 vias in alignment, any number of vias could be added in a line, such that current would be returned under the capacitor in a position complementary to the current flowing through the capacitor, which minimizes parasitic inductance. It is contemplated that more vias may be utilized as smaller geometries become feasible. These concepts can be applied to circuit boards of various manufacture, whether printed or not.

The advantages of this invention are many. Reducing the number of capacitors for a particular PCB will save money in the number of capacitors used as well as the number of solder points needed. Reduction in the number of capacitors can also increase layout flexibility and even reduce the overall size of the PCB board needed. As an example of the significance of this invention, in one example, PCB circuitry using this invention is as effective with 25 capacitors as a conventional design of FIG. 1 is with 106 capacitors.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. A capacitor mounting structure for printed circuit boards wherein the capacitor includes first and second terminals which are connected to first and second conductor planes in the printed circuit board in a manner to minimize parasitic inductance, comprising:

a surface mountable capacitor, comprising:

a dielectric section having first and second opposing ends and including at least one lateral face intermediate of said first and second ends;

a first terminal including a first edge portion electrically terminating said dielectric section at said first end and a first conductive terminal extension extending from said first edge portion below said at least one lateral face; and a second terminal including a second edge portion electrically terminating said dielectric section at said second end and a second conductive terminal extension extending from said second edge portion below said at least one lateral face;

said capacitor having a central dielectric section defined between said first and second conductive terminal extensions;

a printed circuit board having an upper surface for receiving electronic components including capacitors, said printed circuit board including first and second conductor planes generally parallel to said upper surface, at least one of said conductor planes being imbedded in said printed circuit board;

first and second vias mounted in said printed circuit board, each of said vias including a tubular conductor section and a substantially flat conductive pad extending beneath said central dielectric section from one end of said tubular conductor section, said first via being electrically connected to said first conductor plane and said second via being electrically connected to said second conductor plane, said tubular conductor sections of said first and second vias being positioned immediately adjacent to each other between said first and second terminals of said capacitor and beneath said capacitor central dielectric section with said capacitor being mounted onto said upper surface of said printed circuit board with said first and second terminals of said capacitor being electrically connected by said first and second conductive terminal extensions, respectively, to said first and second conductive pads of said vias, thereby minimizing parasitic inductance associated with said capacitor.

2. The structure set forth in claim 1, including:

said first conductive pad including a conductor extension extending into electrical connection with said first via;

said second conductive pad including an extension extending into electrical connection with said second via and juxtaposed with said first conductive pad extension.

3. The structure set forth in claim 1, including:

said first and second via conductor sections positioned vertically aligned in said printed circuit board inwardly of said first and second terminals of said capacitor and beneath said capacitor central dielectric section.

4. The structure set forth in claim 1, wherein said first and second via conductor sections are positioned between said first and second conductive terminal extensions of said respective first and second terminals of said capacitor.

5. The structure set forth in claim 4, including:

said first conductive pad including a conductor extension extending into electrical connection with said first via; and said second conductive pad including an extension into electrical connection with said second via and juxtaposed with said first conductive pad extension.

6. The structure set forth in claim 1, including:

said first and second via conductor sections positioned in substantial vertical alignment within said printed circuit board.

7. A capacitor mounting structure for mounting capacitors on printed circuit boards to minimize parasitic inductance, comprising:

a printed circuit board having an upper surface for receiving electronic components including capacitors, first and second conductor planes generally parallel to said upper surface, and at least one of said conductors planes being imbedded in said printed circuit board;

a capacitor mounted onto said upper surface of said printed circuit board, said capacitor comprising:

a dielectric section having first and second opposing ends and including at least one lateral face intermediate of said first and second ends;

a first terminal including a first edge portion electrically terminating said dielectric section at said first end and a first conductive terminal extension extending from said first edge portion below said at least one lateral face; and a second terminal including a second edge portion electrically terminating said dielectric section at said second end and a second conductive terminal extension extending from said second edge portion below said at least one lateral face;

said capacitor having a central dielectric section defined between said first and second conductive terminal extensions;

first and second vias mounted in said printed circuit board, each of said vias including a conductor section and a substantially flat conductive pad extending beneath said central dielectric section from an upper end of said conductor section;

said first via being electrically connected to said first conductor plane of said printed circuit board;

said second via being electrically connected to said second conductor plane of said printed circuit board;

said via conductor sections being mounted in said printed circuit board between said first and second terminals of said capacitor and beneath said capacitor central dielectric section;

said first and second terminals of said capacitor being electrically connected by said first and second conductive terminal extensions, respectively, to said first and second conductive pads of said vias thereby minimizing parasitic inductance associated with said capacitor.

8. The structure set forth in claim 7, including:

said first and second via conductor sections positioned vertically aligned in said printed circuit board inwardly of said first and second terminals of said capacitor and beneath said capacitor central dielectric section.

9. The structure set forth in claim 7, including:

said first conductive pad including a conductor extension from a central portion into electrical connection with said first via;

said second conductive pad including a conductor extension from a central portion into electrical connection with said second via juxtaposed with said first conductive pad extension.

10. The structure set forth in claim 7, including:

said first and second vias positioned in substantial vertical alignment within said printed circuit board.

11. The structure set forth in claim 7, including:

said capacitor central dielectric section being positioned over said first and second via conductor sections, which are approximately aligned with a transverse vertical centerline between said first and second opposing ends of said capacitor.

12. The structure set forth in claim 7, wherein said first and second vias are positioned between said first and second conductive terminal extensions of said respective first and second terminals of said capacitor.

13. The structure set forth in claim 7, including:

said first conductive pad including a conductor extension from a central portion into electrical connection with said first via;

said second conductive pad including a conductor extension from a central portion into electrical connection with said second via juxtaposed with said first conductive pad extension.

14. The structure set forth in claim 12, including:

said first and second vias positioned in substantial vertical alignment within said printed circuit board.

* * * * *

UNITED STATES PATENT AND TRADEMARK OFFICE
CERTIFICATE OF CORRECTION

| | | |
|---|---|---|
| PATENT NO. | : 5,459,642 | Page 1 of 1 |
| APPLICATION NO. | : 08/253980 | |
| DATED | : October 17, 1995 | |
| INVENTOR(S) | : D. Joe Stoddard | |

It is certified that error appears in the above-identified patent and that said Letters Patent is hereby corrected as shown below:

Column 6,
Line 37, delete "claim 1," and insert -- claim 4, --.

Column 8,
Line 17, delete "claim 7," and insert -- claim 12, --.

Signed and Sealed this

Twenty-seventh Day of June, 2006

JON W. DUDAS
*Director of the United States Patent and Trademark Office*